United States Patent
Ker et al.

(10) Patent No.: US 6,933,573 B2
(45) Date of Patent: Aug. 23, 2005

(54) ELECTROSTATIC DISCHARGE PROTECTION CIRCUIT OF NON-GATED DIODE AND FABRICATION METHOD THEREOF

(75) Inventors: Ming-Dou Ker, Hsinchu (TW); Kei-Kang Hung, Changhua Hsien (TW); Tien-Hao Tang, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 162 days.

(21) Appl. No.: 10/060,743
(22) Filed: Jan. 30, 2002
(65) Prior Publication Data
    US 2003/0139024 A1 Jul. 24, 2003
(30) Foreign Application Priority Data
    Jan. 23, 2002 (TW) ........................................ 91101026 A
(51) Int. Cl.[7] ............................................. H01L 23/62
(52) U.S. Cl. ........................................................ 257/355
(58) Field of Search .......................................... 257/355

(56) References Cited

U.S. PATENT DOCUMENTS

| | | | | | |
|---|---|---|---|---|---|
| 5,920,096 | A | * | 7/1999 | Lee | 257/355 |
| 5,923,067 | A | * | 7/1999 | Voldman | 257/349 |
| 6,074,899 | A | * | 6/2000 | Voldman | 438/155 |
| 6,118,155 | A | * | 9/2000 | Voldman | 257/360 |
| 6,242,763 | B1 | * | 6/2001 | Chen et al. | 257/107 |
| 6,274,910 | B1 | * | 8/2001 | Yu | 257/355 |
| 6,388,857 | B1 | * | 5/2002 | Sato et al. | 361/111 |
| 6,521,952 | B1 | * | 2/2003 | Ker et al. | 257/360 |
| 6,529,421 | B1 | * | 3/2003 | Marr et al. | 365/189.09 |
| 6,573,566 | B2 | * | 6/2003 | Ker et al. | 257/355 |
| 6,576,958 | B2 | * | 6/2003 | Ker et al. | 257/355 |
| 6,617,649 | B2 | * | 9/2003 | Chang et al. | 257/355 |
| 6,645,820 | B1 | * | 11/2003 | Peng et al. | 438/372 |
| 2002/0084490 | A1 | * | 7/2002 | Ker et al. | 257/355 |
| 2002/0109153 | A1 | * | 8/2002 | Ker et al. | 257/199 |
| 2003/0080386 | A1 | * | 5/2003 | Ker et al. | 257/347 |
| 2003/0122192 | A1 | * | 7/2003 | Ker et al. | 257/347 |
| 2003/0146474 | A1 | * | 8/2003 | Ker et al. | 257/347 |

* cited by examiner

*Primary Examiner*—W. David Coleman

(57) ABSTRACT

A non-gated diode structure of a silicon-on-insulator, having a silicon-on-insulator substrate, a pair of isolating structures, a first type doped region and a second type doped region. The silicon-on-insulation substrate has a stack of a substrate, an insulation layer and a silicon layer. The isolating structures are located in the silicon layer to define a well region. The first and second type doped regions are located in the well and are adjacent to the isolating structures. Such a non-gated diode structure can be applied to an electrostatic discharge protection circuit to increase the electrostatic discharge protection voltage or current. In addition, a fabrication method of the non-gated diode is also introduced. This non-gated diode can be also fabricated in the general bulk CMOS process, and used in the on-chip ESD protection circuits.

21 Claims, 9 Drawing Sheets

ELECTROSTATIC DISCHARGE PROTECTION CIRCUIT OF NON-GATED DIODE AND FABRICATION METHOD THEREOF

CROSS-REFERENCE TO RELATED APPLICATION

This application claims the priority benefit of Taiwan application serial no. 91101026, filed Jan. 23, 2002.

BACKGROUND OF THE INVENTION

1. Field of the Invention

The invention relates in general to an electrostatic discharge protection circuit and a fabrication method thereof, and more particularly, to an electrostatic discharge protection circuit of a non-gated diode and a fabrication method thereof that uses the silicon-on-insulation (SOI) fabrication process.

2. Description of the Related Art

Silicon-on-insulator technology is a prime contender for low voltage, and high-speed applications because of its advantages over bulk-Si technology in high isolation, latch-up immunity, and smaller junction capacitance. However, electrostatic discharge (ESD) is a major concern for SOI technology.

The protection level provided by an ESD protection circuit is determined by the amount of current that it can sink while clamping the voltage to a small value. The device failure is initiated by thermal runaway and followed by catastrophic damage during an ESD pulse. In SOI devices, the presence of the buried oxide layer having a thermal conductivity $1/100^{th}$ of Si causes increased device heating, which in turn accelerates thermal runaway under ESD stress condition.

FIG. 1 depicts a cross-sectional view of a gated-diode (called as Lubistor) in SOI published in the article of S. Voldman et al. "CMOS-on-SOI ESD protection networks," in Proc. Of EOS/ESD Symp. 1996, pp. 291–301. As shown in FIG. 1, the SOI gated diode is formed on a SOI substrate which includes a substrate 10, a buried oxide layer 12 and a silicon layer. Shallow trench isolation (STI) structures 14 are formed in the silicon layer. A P+ region 20 and an N+ region 16 are formed in the silicon layer between the STI structures 14, while a N-type or P-type doped region 18 is formed in the silicon layer between the P+ region 20 and the N+ region 16. If the N-type doped region 18 is selected, the P+ region 20 and the N− doped region 18 construct a SOI diode. In contrast, if the P-type doped region 18 is formed, the N+ region 16 and the P-type doped region 18 construct a SOI diode. A gate is further formed on the doped region 18. The gate includes a P+ region 24 and an N+ region, a spacer 26 and a gate oxide 28.

The P+ region 20 and the N+ region 16 are coupled to voltage V1 and V2 as the voltage application terminals for the SOI diode. Taking the SOI diode formed of the P+ region 20 and the N-type doped region 18 as an example, the SOI diode is forward biased if V1 is positive relative to V2. On the contrary, if V2 is positive relative to V1, the SOI diode is reverse biased.

If the heat generated by the ESD voltage at the junction between the P+ region 20 and the N-type doped region 18 is small, the SOI diode can withstand a higher ESD voltage. The heat generated at the PN junction is joule heating. When the maximum temperature of the SOI diode reaches its intrinsic temperature, $T_{intrinsic}$, second order breakdown occurs. Therefore, to obtain a better ESD protection, the power density and joule heating have to be reduced in the device structure.

SUMMARY OF THE INVENTION

The invention provides an ESD protection circuit of a non-gated diode and a fabrication method thereof The non-gated diode has low power density.

The ESD protection circuit of a non-gated diode and the fabrication method thereof can be applied to a SOI circuit, so as to enhance the voltage withstanding effect.

Another objective of the invention is to provide an ESD protection circuit of a non-gated diode and the fabrication method thereof applicable to SOI fabrication process or the bulk CMOS fabrication process.

To achieve the above characteristics and objectives, the invention provides an ESD protection circuit of a non-gated diode structure, and a fabrication method thereof as described as follows.

A non-gated diode structure of a silicon on insulator is provided. The silicon on insulator includes a substrate, an insulator layer and a silicon layer sequentially stacked together. A pair of isolating structures is located in the silicon layer to define a well region. A first type doped region and a second type doped region are located in the well region and are respectively adjacent to the isolating structures.

The invention further provides a non-gated diode structure of a silicon on insulator. The silicon on insulator includes a substrate, an insulator layer and a silicon layer stacked in sequence. A pair of isolating structures is formed in the silicon layer. A first well region and a second well region adjacent to each other are formed in the silicon layer between the isolating structures. A first doped region and a second doped region are respectively formed in the first well region and the second well region and are adjacent to the isolating structures. The junction of the non-gated diode of the silicon on insulator is thus the junction between the first and the second well regions.

An ESD protection circuit of a non-gated diode coupled between input pads and internal circuit is further provided in the invention. The ESD protection circuit comprises a Vdd voltage supply rail, a Vss voltage supply rail, a first diode, a second diode, a first diode series, a second diode series and an input resistor. The first diode has an anode coupled to the Vdd voltage supply rail and a cathode coupled to a node. The second diode has a cathode coupled to the Vss voltage supply rail and an anode coupled to the node. The first diode series comprises a plurality of serially connected diodes with an anode coupled to the Vdd voltage supply rail and a cathode coupled to the node. The second diode series comprises a plurality of serially connected diodes with a cathode coupled to the Vss voltage supply rail and an anode coupled to the node. The input resistor has a first end coupled to the node and a second end coupled to the internal circuit.

When a voltage positive relative to the Vdd voltage supply rail is applied to the input pads, the ESD protection circuit of the non-gated diode provides a discharge path from the first diode to the high-voltage supplying line. When a voltage negative relative to the Vss voltage supply rail is applied to the input pads, the ESD device of the non-gated diode provides a discharge path from the second diode to the Vss voltage supply rail. When a voltage negative relative to the Vdd voltage supply rail is applied to the input pads, the ESD protection circuit of the non-gated diode provides a discharge path through the second diode, the second diode series and the first diode series to the high-voltage supplying line. When a voltage positive relative to the Vss voltage supply rail is applied to the input pads, the ESD device of the non-gated diode provides a discharge path through the first diode, the first diode series, and the second diode series to the Vss voltage supply rail.

An ESD protection circuit is further provided and coupled between an output pad and a pre-driver. The ESD protection circuit comprises a Vdd voltage supply rail, a Vss voltage supply rail, a first diode, a second diode, a first diode series, a second diode series, a first type MOS transistor and a second type MOS transistor. The Vdd voltage supply rail and the Vss voltage supply rail are coupled to the pre-driver. The first diode has an anode coupled to the Vdd voltage supply rail and a cathode coupled to a node. The second diode has a cathode coupled to the Vss voltage supply rail and an anode coupled to the node. The first diode series comprises a plurality of serially connected diodes, of which an anode is coupled to the Vdd voltage supply rail and a cathode is coupled to the node. The second diode series comprises a plurality of serially connected diodes with a cathode coupled to the Vss voltage supply rail and an anode coupled to the node. The first type has a source region coupled to the Vdd voltage supply rail, a drain region coupled to the node and a gate coupled to the pre-driver. The second type MOS transistor has a source region coupled to the Vss voltage supply rail, a drain region coupled to the node and a gate coupled to the gate of the first type MOS transistor.

In the above ESD protection circuit, when a voltage positive relative to the high voltage supply line is applied to the output pad, a discharge path is provided through the first diode to the Vdd voltage supply rail. When a voltage negative relative to the Vss voltage supply rail is applied to the output pad, a discharge path is provided through the second diode to the Vss voltage supply rail. When a voltage negative relative to the Vdd voltage supply rail is applied to the output pad, a discharge path is provided through the second diode, the second diode series, the first diode series and the high-voltage discharge line. When a voltage positive relative to the Vss voltage supply rail is applied to the output pad, a discharge path through the first diode, the first diode series and the second diode series to the Vss voltage supply rail is provided.

In another embodiment of the invention, an ESD protection circuit of a non-gated diode is provided and coupled between an input pad and an internal circuit. The protection circuit comprises the following devices. A Vdd voltage supply rail and a low-voltage supply are coupled to the internal circuit. A first diode and a second diode are serially connected to each other. The anode of the first diode is coupled to a node, while the cathode of the second diode is coupled to the Vdd voltage supply rail. A third diode and a fourth diode are serially connected to each other. The anode of the third diode is coupled to the Vss voltage supply rail, while the cathode of the fourth diode is coupled to the node. An input resistor has a first terminal coupled to the node and a second terminal coupled to the internal circuit. A MOS transistor has a gate and a source region connected to the Vss voltage supply rail, and a drain region coupled to the second terminal of the ballast resistor. An ESD clamp circuit is coupled between the high- and low-voltage supply lines.

The above discharge clamp circuit comprises a plurality of diodes serially connected together with an anode coupled to the Vdd voltage supply rail and a cathode coupled to the Vss voltage supply rail.

The invention further provides a method for forming a non-gated diode on a SOI. A SOI comprising a substrate, an insulation layer and a silicon layer are provided. A pair of isolating structures is formed in the silicon layer to define a well region. A first type doped region and a second doped region are formed in the well region and respectively adjacent to one of the isolating structures.

The invention further provides another method for forming a non-gated diode on a SOI. A SOI comprising a substrate, an insulation layer and a silicon layer are provided. A pair of isolating structures is formed in the silicon layer. A first well region and a second well region are formed in the silicon layer between the isolating structures, and the first and second well regions are adjacent to each other. A first type doped region and a second doped region are formed in the first and second well regions, respectively. Thereby, the junction of the non-gated diode of the SOI is the junction between the first and second well regions.

The invention further provides a non-gated diode structure of a CMOSI, comprising: a substrate having a well region therein; a pair of blocking isolation structures in the substrate; a first type doped region located in the well region and between the blocking isolation structures; and a pair of second type doped regions located in the well region and respectively adjacent to the blocking isolation structure, wherein each second type doped region is separated from the first type doped region by the well.

The invention further provides a method of forming a non-gate diode of a CMOS, comprising: providing a substrate having a well region therein; forming a pair of blocking isolation structures in the substrate; forming a first type doped region located in the well region and between the blocking isolation structures; and forming a pair of second type doped regions located in the well region and respectively adjacent to the blocking isolation structure, wherein each second type doped region is separated from the first type doped region by the well.

Both the foregoing general description and the following detailed description are exemplary and explanatory only and are not restrictive of the invention, as claimed.

DESCRIPTION OF THE PREFERRED EMBODIMENTS

Figure 1:
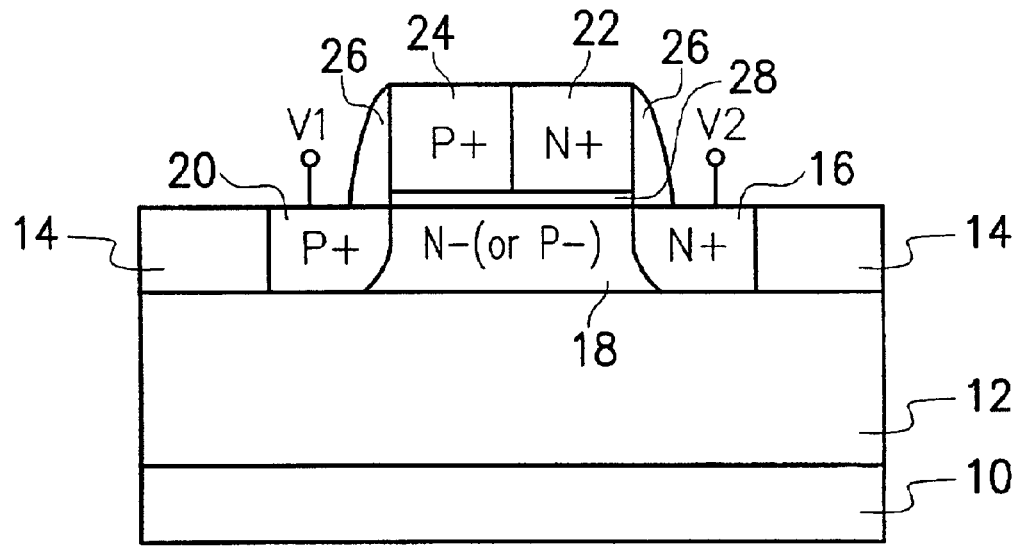
FIG. 1 shows a cross sectional view of a gated diode of a SOI, such as an ESD protection circuit of CMOS of a SOI.
Figure 2:
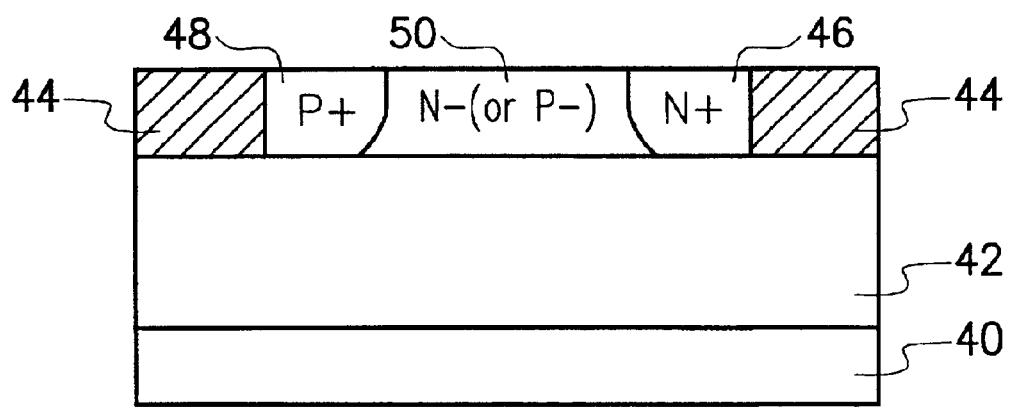
FIG. 2 shows a cross sectional view of a non-gated diode with a STI-blocking structure in one embodiment of the invention.

FIG. 2 is a cross-sectional view showing an embodiment of a non-gated diode with a STI-blocking structure. In FIG. 2, the SOI non-gated diode is formed on a SOI substrate that includes a substrate 40, an insulation layer 42 and a silicon layer. The substrate 40 includes either a P-type substrate or an N-type substrate. The insulation layer 42 includes a buried oxide layer. The SOI non-gated diode with the STI blocking structure is formed in the silicon layer. In the silicon layer, the SOI non-gated diode is formed between two STI blocking structures 44. That is, the doped region of the SOI non-gated diode is isolated by the two STI structures. A lightly doped well region 50 doped with P-type or N-type ions (P-well or N-well) is formed on the insulation layer 42 between the two STI structures. In addition, heavily doped P-type (P+) diffusion region 48 and heavily doped N-type (N+) diffusion region 46 are formed in the corners of the P- or N-well region 50 adjacent to the two STI structures 44.

Figure 3A:
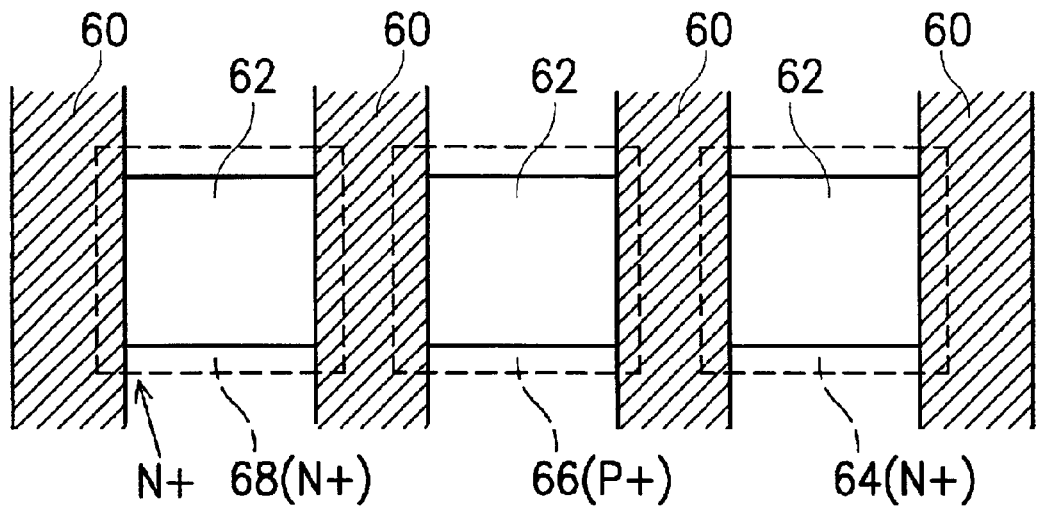
FIG. 3A to FIG. 3B show the top views of the STI-isolating structures and the STI-blocking structure.
Figure 3B:
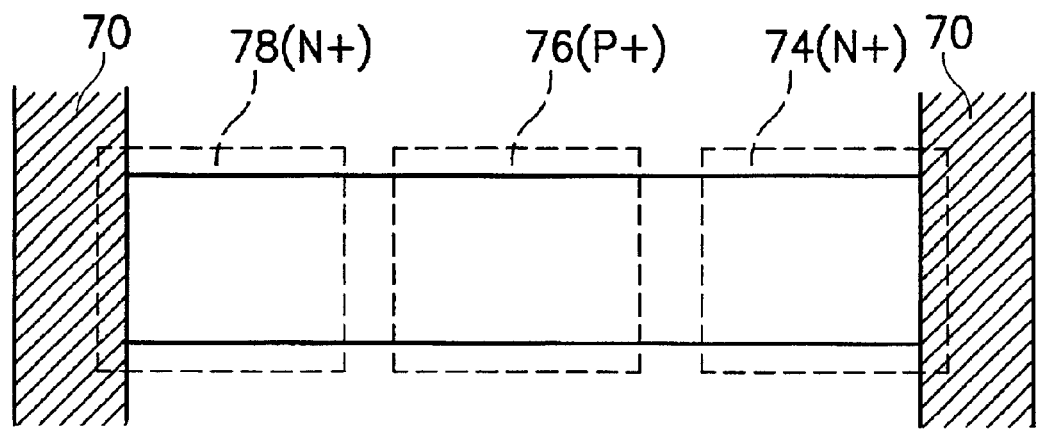

The STI structures formed in the SOI fabrication process include STI-isolating structure and STI-blocking structure. FIGS. 3A and 3B respectively show the top views of these two structures. In the following description, it will be seen that the STI-isolating structure cannot form the SOI diode since each doped region is fully isolated by the STI structure. In FIG. 3A, a plurality of STI structures 60 is formed in the silicon layer on the insulation layer 62. The doped regions 64 (N+), 66 (P+) and 68 (N+) are formed between the STI structures 60 and unconnected to each other. Therefore, a P-N junction of the diode cannot be formed. In FIG. 3B, the STI structures 70 are formed in the silicon layer on the insulation layer 72, while the doped regions 74 (N+), 76 (P+) and 78 (N+) are formed between two STI structures 70. A P-N junction of a diode can thus be formed.

FIGS. 4A to 4G illustrate the STI-isolating structure fabricated using SOI process, while FIGS. 5A to 5G illustrate the STI-blocking structure fabricated using SOI process. From the results, it is shown that the doped regions formed in the process for the STI-isolating structure are not connected to each other, so that a P-N junction of the diode cannot be formed.

Figures 4A, 5A:
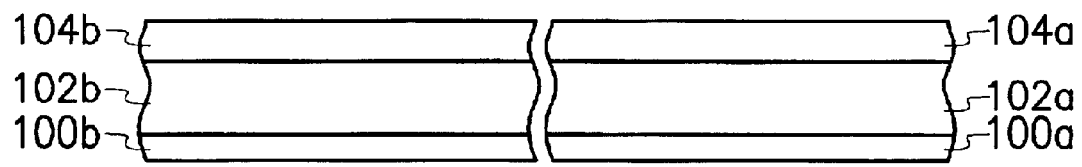
FIG. 4A to FIG. 4G show the fabrication process of STI-isolating structure using SOI fabrication process.
FIG. 5A to FIG. 5G show the fabrication process of STI-blocking structure using SOI fabrication process.

Referring to FIGS. 4A and 5A, substrates 100a, 100b are provided. Insulating layers 102a, 102b are formed on the substrates 100a, 100b, respectively. A silicon layer is formed on the insulating layers 102a and 102b. The insulating layers 102a, 102b include buried oxide layer. In addition, P-type ion is implanted into the silicon layer to form P-well regions 104a, 104b. Thus far, the process steps are similar.

Figures 4B, 5B:
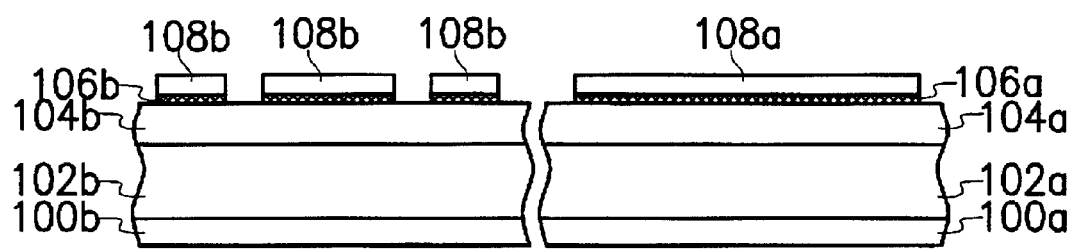
Figures 4C, 5C:
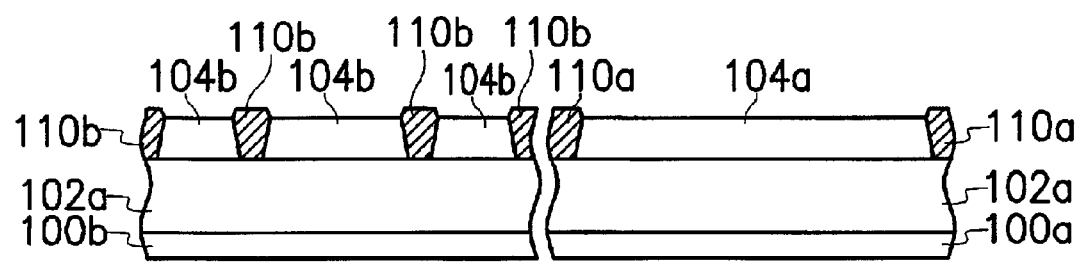

FIGS. 4B and 4C, a pad oxide layer 106b and a photoresist layer 108b are formed with the region for forming the STI structure exposed. Using the pad oxide layer 106b and the photoresist layer 108b as a mask, the P-well region (silicon layer) 104b is etched to form a trench. The pad oxide layer 106b and the photoresist layer 108b are removed. An insulating material is filled into the trench, followed by a planarization step to form a STI structure.

Figures 4D, 5D:
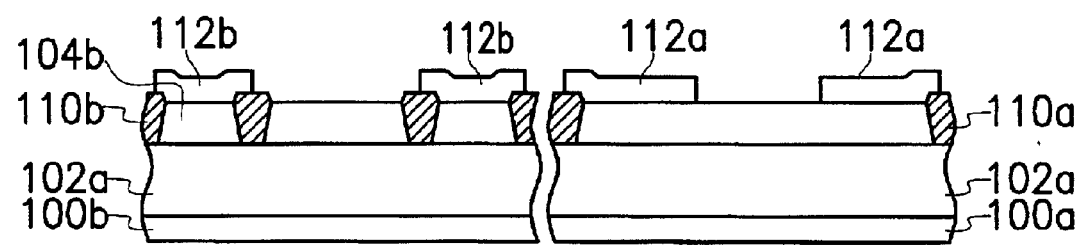
Figures 4E, 5E:
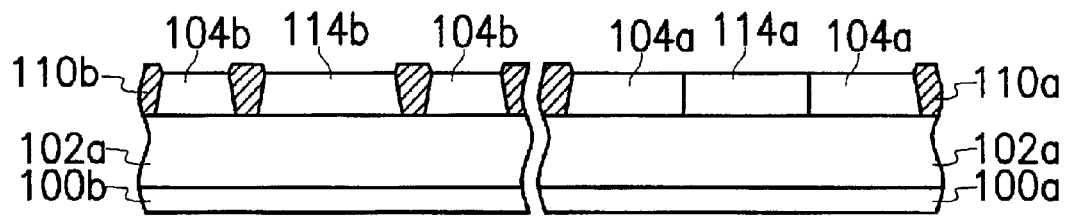
Figures 4F, 5F:
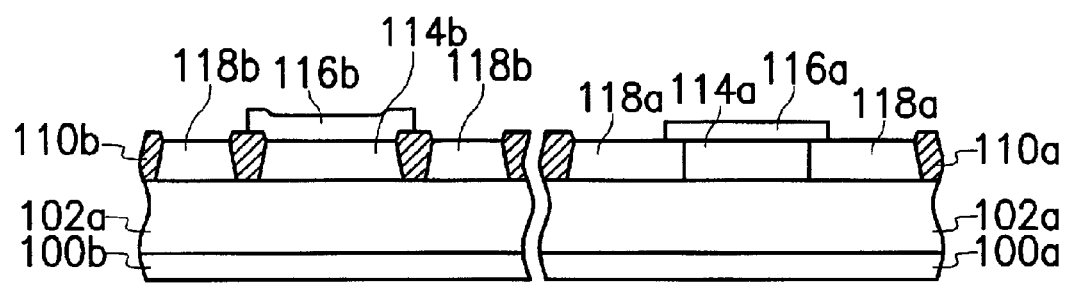
Figures 4G, 5G:
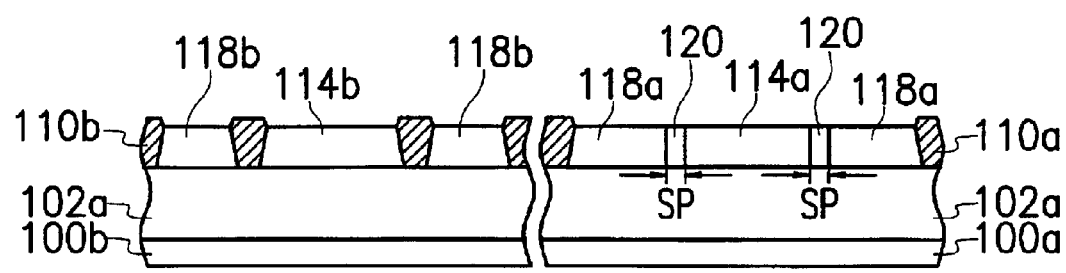

Referring to FIG. 4D, a photoresist layer 112b is formed on a part of the P-well region 104b and a part of the STI structure 110b, while the P-well region 104b encircled by the STI structure is exposed. An ion implantation step is performed to implant P-type ions into the exposed P-well region 104b, so as to form a P+ region 114b. In FIG. 4E, the photoresist layer 112b is removed. In FIG. 4F, a photoresist layer 116b is formed on the P+ region 114b, and an ion implantation step is performed. N-type ion is implanted into the exposed P-well region to form N+ region 118b. The photoresist layer 116b is removed as shown in FIG. 4G.

Referring to FIGS. 5B and 5C, a pad oxide layer 106a and a photoresist layer 108a are formed, while the region for forming the STI structure is exposed. Using the pad oxide layer 106a and the photoresist layer 108a as a mask, the P-well region 104a is etched to form a trench. The pad oxide layer 106a and the photoresist layer 108a are removed. An insulating material is filled into the trench, followed by a planarization step to form the STI structure. Referring to FIG. 5D, a photoresist layer 112a is formed on a part of the P-well region 104a and a part of the STI structure 110a, while a part of the P-well region 104a is exposed. An ion implantation step is performed to implant P-type ion into the exposed P-well region 104a, so that a P+ region 114a is formed. In FIG. 5E, the photoresist layer 112a is removed. In FIG. 5F, a photoresist layer 116a is formed in the P+ region 114a, and an ion implantation step is performed. The width of the photoresist layer 116a is slightly larger than the underlying P+ region 114a. N-type ion is implanted into the P-well region 104a to form the N+ region 118a. The photoresist layer 116a is removed. In FIG. 5G, as the width of the photoresist layer 116a is slightly larger than the underlying P+ region 114a, a P-well region 120 is formed between the N+ region 118a and the P+ region 114a with a width SP.

The key parameters of the non-gated STI-blocking diode of the SOI CMOS fabrication process used for ESD protection are diode dimension, well doping concentration, and the spacing SP between the cathode node and the anode node of the diode. The spacing SP not only affects the on-resistance of the diode in ESD discharging under forward biased, but also affects the reverse breakdown voltage of the diode. Therefore, by properly controlling the spacing SP, any proper reverse breakdown voltage of the ESD protection circuit can be fabricated.

FIGS. 6A to 6G show using bulk CMOS process to form the STI-isolating structure, while FIGS. 7A to 7G show using bulk CMOS process to form the STI-blocking structure.

Figures 6A, 7A:
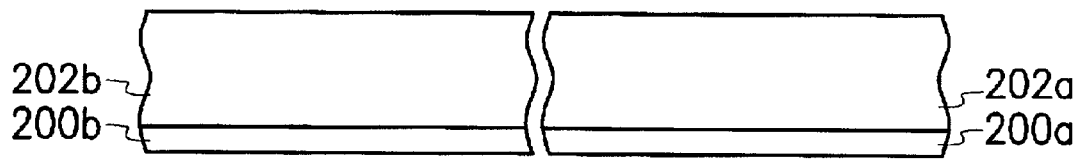
FIG. 6A to FIG. 6G show the fabrication process of STI-isolating structure using bulk CMOS fabrication process.
FIG. 7A to FIG. 7G show the fabrication process of STI-blocking structure using bulk CMOS fabrication process.

Referring to FIGS. 6A and 7A, substrates 200a, 200b are provided. P-well regions 202a, 202b are formed in the substrates 200a, 200b, respectively. Thus far, the process steps are similar.

Figures 6B, 7B:
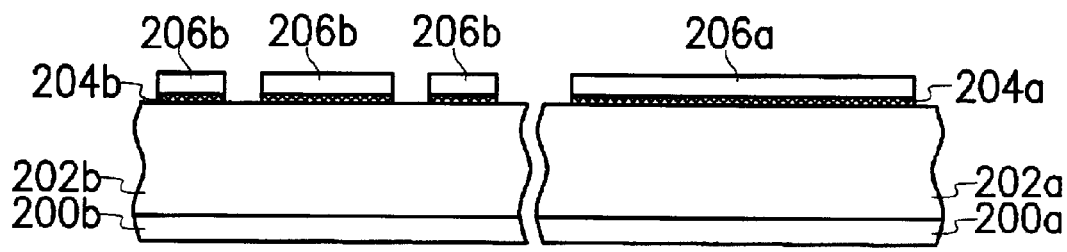
Figures 6C, 7C:
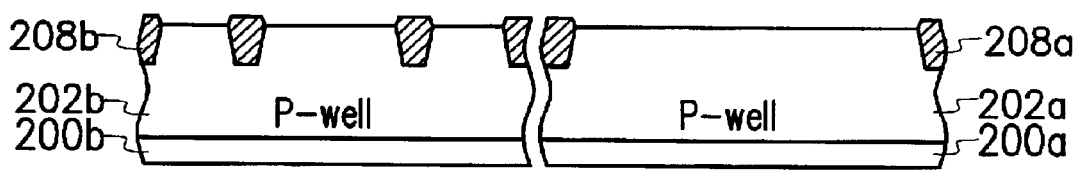
Figures 6D, 7D:
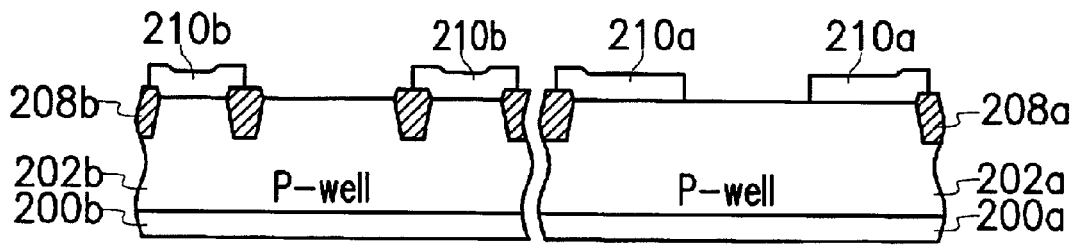
Figures 6E, 7E:
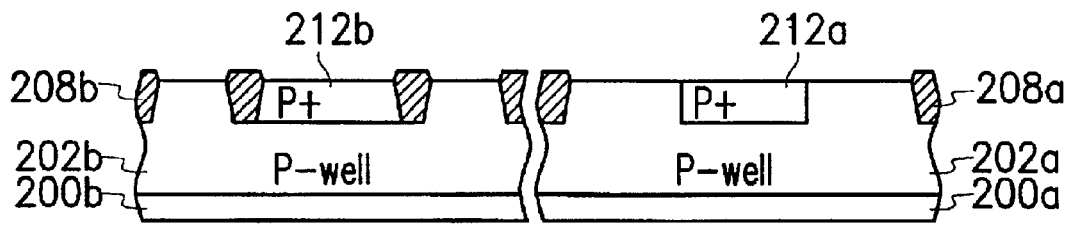
Figures 6F, 7F:
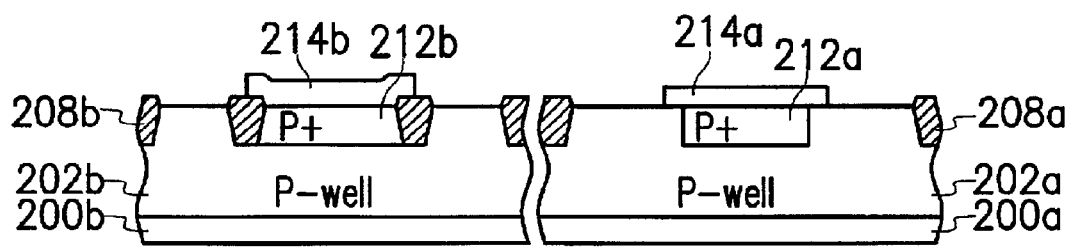

Referring to FIGS. 6B and 6C, a pad oxide layer 204b and a photoresist layer 206b are formed with the region for forming STI structure exposed. Using the pad oxide layer 204b and the photoresist layer 206b as a mask, the P-well region 202b is etched to form a trench. The pad oxide layer 204b and the photoresist layer 206b are removed. An insulating material is filled into the trench, followed by a planarization step to form a STI structure. Referring to FIG. 6D, a photoresist layer 210b is formed on a part of the P-well region 202b and a part of the STI structure 208b, while P-well region 202b encircled by the STI structure is exposed. An ion implantation step is performed to implant P-type ions into the exposed P-well region 202b, so as to form a P+ diffusion region 212b. In FIG. 6E, the photoresist layer 210b is removed. In FIG. 6F, a photoresist layer 214b is formed on the P+ diffusion region 212b, and an ion implantation step is performed. N-type ion is implanted into the exposed P-well region 202b to form an N+ diffusion region 216b. The photoresist layer 214b is removed as shown in FIG. 6G.

Referring to FIGS. 7B and 7C, a pad oxide layer 204a and a photoresist layer 206a are formed, while the region for forming the STI structure is exposed. Using the pad oxide layer 204a and the photoresist layer 206a as a mask, the P-well region 202a is etched to form a trench. The pad oxide layer 204a and the photoresist layer 206a are removed. An insulating material is filled into the trench, followed by a planarization step to form the STI structure. Referring to FIG. 7D, a photoresist layer 210a is formed on a part of the P-well region 202a and a part of the STI structure 208a, while a part of the P-well region 202a is exposed. An ion implantation step is performed to implant P-type ion into the exposed P-well region 202a, so that a P+ region 212a is formed. In FIG. 7E, the photoresist layer 210a is removed. In FIG. 7F, a photoresist layer 214a is formed in the P+ region 212a, and an ion implantation step is performed. The width of the photoresist layer 214a is slightly larger than the underlying P+ region 212a. N-type ion is implanted into the P-well region 202a to form N+ region 216a. The photoresist layer 214a is removed. In FIG. 7G, as the width of the photoresist layer 214a is slightly larger than the underlying P+ region 212a, a P-well region 218 is formed between the N+ region 216a and the P+ region 212a with a width SP.

Figures 6G, 7G:
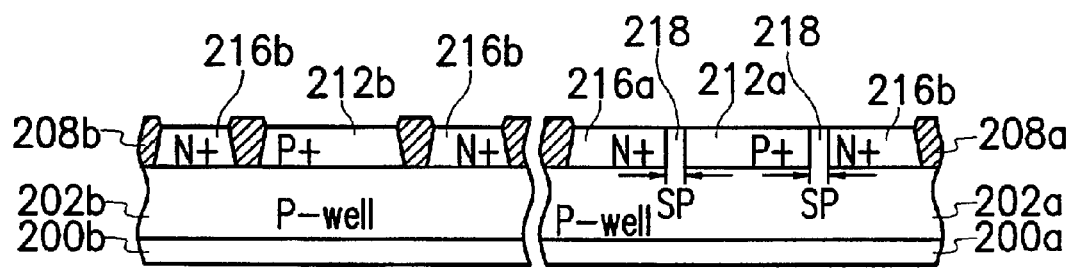

According to the above, from the comparison between FIG. 6G and FIG. 7G, it can be seen that only the process with STI-blocking structure can form a diode with adjacent lateral P-N junction.

The key parameters of the non-gated STI-blocking diode of the bulk CMOS fabrication process used for ESD protection include diode dimension, the well doping concentration, and the spacing SP between the cathode node and the anode node of the diode. The spacing SP not only affects the on-resistance when the diode is forward biased, but also affects the reverse breakdown voltage. Therefore, by properly controlling the spacing SP, any suitable reverse breakdown voltage of the ESD protection circuit can be fabricated.

Figure 8:
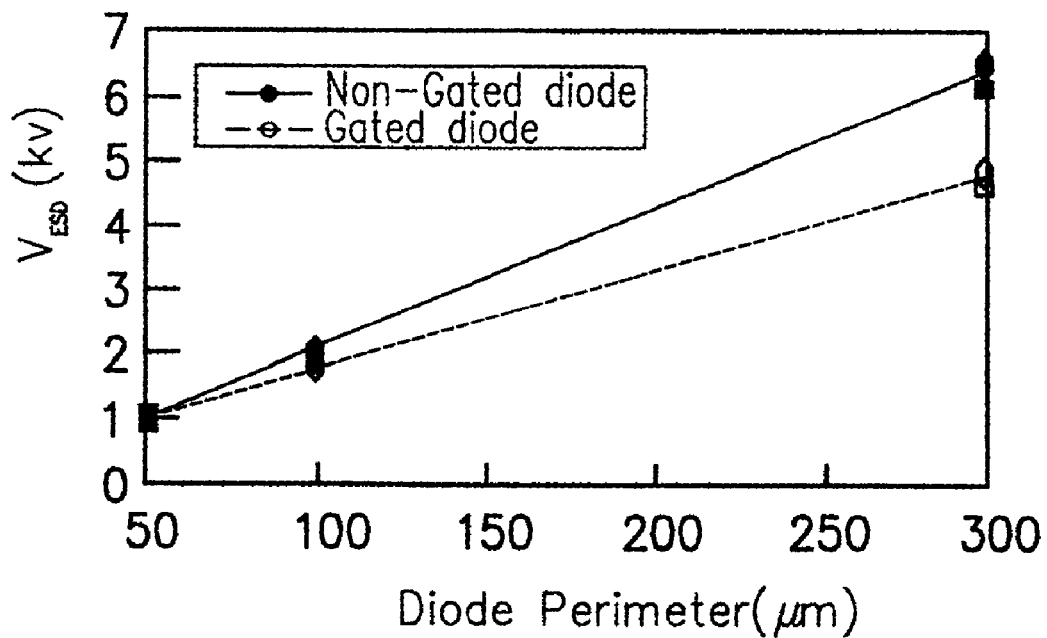
FIG. 8 shows a comparison of Human-Body-Model (HBM) ESD level between the gated diode and the non-gated diode.

FIG. 8 shows the experimental results between the perimeters of the gated and non-gated diode and the ESD voltage. Conclusions as follows can be made. 1. As the diodes becomes wider and wider, the ESD voltage that the device can withstand is greater and larger, so that the internal circuit can be further protected. 2. The ESD voltage that the non-gated SOI diode can withstand is greater than that the gated diode can withstand. As the ESD robustness and the diode perimeters shows a linear relationship, the invention can use the non-gated diode in SOI process or bulk CMOS process to estimate and design the ESD level of an ESD protection circuit.

Figure 9:
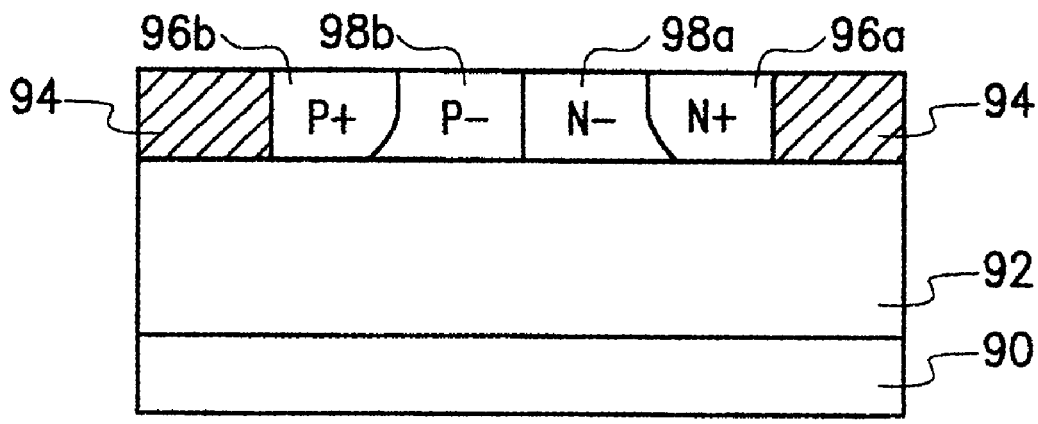
FIG. 9 shows a cross sectional view of a non-gated diode with a STI-blocking structure in another embodiment of the invention.

FIG. 9 shows another embodiment of a non-gated STI-blocking diode. In FIG. 9, the SOI non-gated diode is formed on a SOI substrate that comprises a substrate 90, an insulating layer 92 and a silicon layer. The substrate 90 includes a P- or an N- substrate, while the insulating layer includes a buried oxide layer. The SOI non-gated STI-blocking diode is formed in the silicon layer. In the silicon layer, the SOI diode is formed between two STI structures 94. That is, the doped regions of the SOI diode are isolated by two STI structures. On the insulating layer 92 and between the STI structures, two neighboring lightly doped P-type and N-type doped regions (P-well and N-well regions) are formed. In addition, heavily doped P+ diffusion region 96b and N+ diffusion region 96a are formed between the STI structures 94 and the P-well region and N-well region 98b, 98a. The difference between this embodiment and FIG. 2 includes that the PN junction of the SOI non-gated diode is located in the middle of the whole structure, while the PN junction in FIG. 2 is located at the edge.

Several examples are used to describe the application of the ESD protection circuit of SOI non-gated diode provided by the invention.

Figure 10:
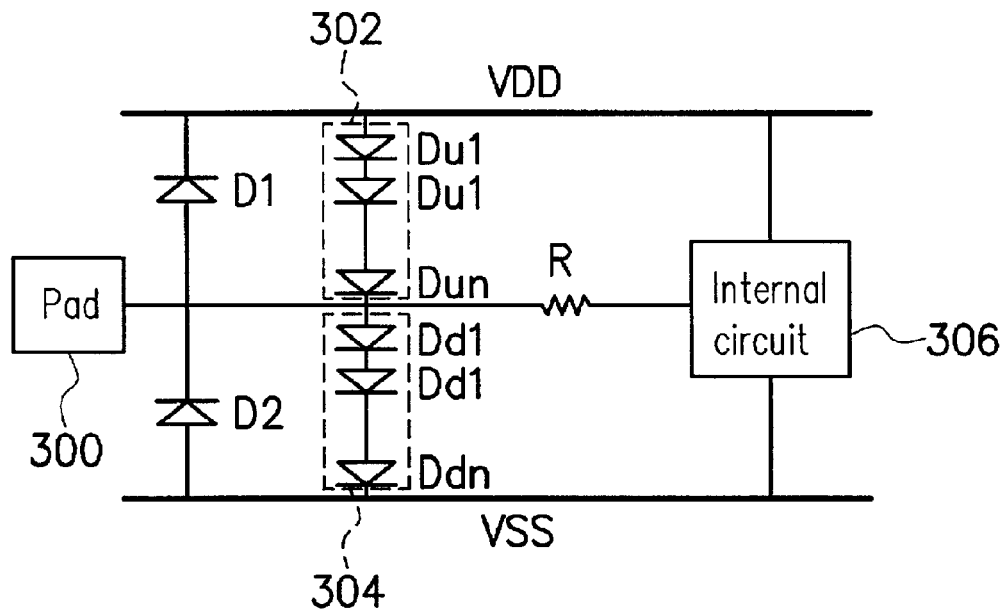
FIG. 10 illustrates the input ESD protection circuit of the SOI non-gated diode.

FIG. 10 illustrates the application of the SOI non-gated diode in FIG. 2 or FIG. 9 in the input ESD protection circuit. The ESD protection circuit includes an input pad 300, a first diode D1, a second diode D2, a first diode series 302, a second diode series 304, an input resistor R, and a Vdd voltage (high-voltage) supply rail and a Vss voltage (low-voltage) supply rail. An internal circuit 306 is connected between the Vdd voltage supply rail, the Vss voltage supply rail and the input resistor R. The first diode D1 has a cathode coupled to Vdd and an anode coupled to the pad 300. The second diode D2 has an anode coupled to Vss, and a cathode coupled to the pad 300. The first diode series 302 includes a plurality of diodes Du1, Du2, . . . , Dun with the anodes and cathodes serially connected to each other. The anode of the diode Du1 is coupled to Vdd, and the cathode of the diode Dun is coupled to the pad 300. The second diode series 304 includes a plurality of diodes Dd1, Dd2, . . . , Ddn with the anodes and cathodes serially connected to each other. The anode of the diode Dd1 is coupled to the pad 300, and the cathode of the diode Ddn is coupled to Vss. Each diode of the first diode D1, the second diode D2, the first diode series 302 and the second diode series 304 includes the SOI non-gated diode as shown in FIG. 2 or FIG. 9. In addition, the input resistor R can be connected to an input buffer (not shown) of the FIG. 10 illustrates the operation method of the input ESD protection circuit. When an ESD event with a voltage positive relative to the Vdd voltage supply rail is applied to the input pad 300, the first diode D1 is forward biased. As the Vss voltage supply rail is floating, the second diode D2 is not effective. Therefore, the ESD event (voltage) is discharged from the first diode D1 to the Vdd voltage supply rail. Similarly, when an ESD event with a voltage negative relative to the Vss voltage supply rail is applied to the input pad 300, the second diode D2 is forward biased. As the Vdd voltage supply rail is floating, the first diode D1 is ineffective. Therefore, the ESD event (voltage) is discharged from the second diode D2 to the Vss voltage supply rail.

When an ESD event with a voltage negative relative to the Vdd voltage supply rail is applied to the input pad 300, the first diode D1 is reverse biased. As the Vss voltage supply rail is floating, the voltage Vss will follow up to the input pad 300 with a negative voltage. Meanwhile, the first diode series 302 (Du1, Du2, . . . , Dun) are forward biased, so that the negative ESD discharge current flows from the first diode series 302 (Du1, Du2, . . . , Dun) to Vdd.

When an ESD event with a voltage positive relative to the Vss voltage supply rail is applied to the input pad 300, the second diode D2 is reverse biased. As the Vdd voltage supply rail is floating, the voltage Vdd will follow up to the input pad 300 with a positive voltage. Meanwhile, the second diode series 304 (Dd1 , Dd2, . . . , Ddn) are forward biased, the ESD discharge current flows from the second diode series 304 (Dd1, Dd2, . . . , Ddn) to Vss.

Figure 11:
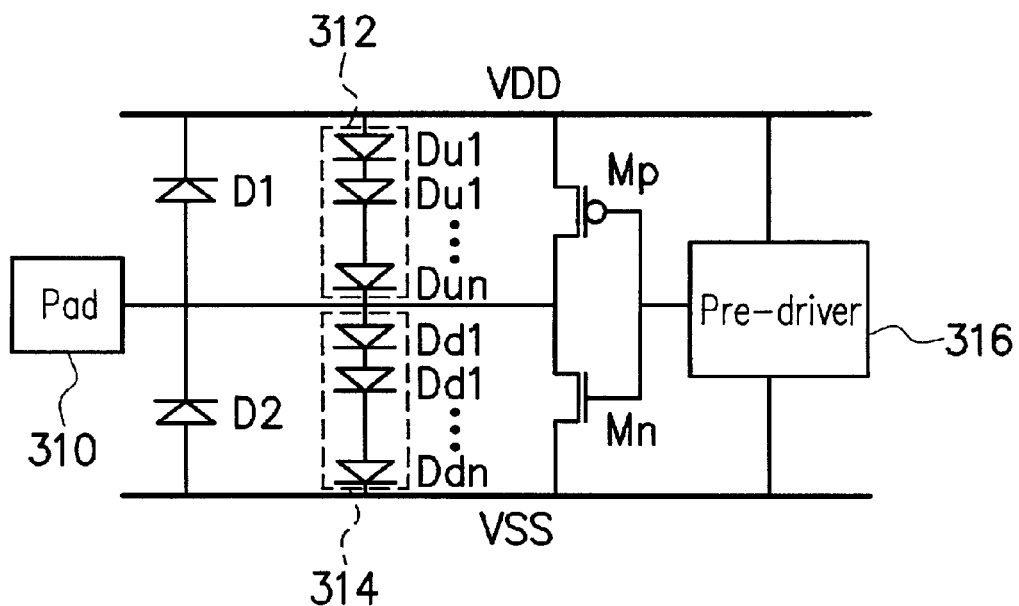
FIG. 11 illustrates the output ESD protection circuit of the SOI non-gated diode.

FIG. 11 illustrates the output ESD protection circuit with the SOI non-gated diode as shown in FIG. 2 or FIG. 9. As shown in FIG. 11, the ESD protection includes an output pad 310, a first diode D1, a second diode D2, a first diode series 312, a second diode series 314, a PMOS transistor Mp, an NMOS transistor Mn, a Vdd voltage supply rail and a Vss voltage supply rail. A pre-driver 316 is coupled between the Vdd and Vss voltage supply rails, the PMOS transistor Mp and the NMOS transistor Mn. The first diode D1 has a cathode coupled to Vdd and an anode coupled to the pad 310. The second diode D2 has an anode coupled to Vss and a cathode coupled to the pad 310. The first diode series 312 comprises a plurality of diodes Du1, Du2, ..., Dun with anodes and cathodes serially connected to each other. The anode of the diode Du1 is coupled to Vdd, and the cathode of the diode Dun is coupled to the pad 310. The second diode series 314 comprises a plurality of diodes Dd1, Dd2, ..., Ddn with anodes and cathodes serially connected to each other. The anode of the diode Dd1 is coupled to pad 310, and the cathode of the diode Ddn is coupled to Vss. The source region of the PMOS transistor Mp is coupled to Vdd, and the source region of the NMOS transistor Mn is coupled to Vss. The drain regions of the PMOS and NMOS transistors Mp and Mn are coupled to the pad 310. Each of the first diode D1, the second diode D2, the first diode series 312 and the second diode series 314 includes the SOI non-gate diode as illustrated in FIG. 2 or FIG. 9.

FIG. 11 illustrates the operation method of the output ESD protection circuit. When an ESD event with a voltage positive relative to the Vdd voltage supply rail is applied to the output pad 310, the first diode D1 is forward biased. As the Vss voltage supply rail is floating, the second diode D2 is not active. Therefore, the ESD event (voltage) is discharged to the Vdd voltage supply rail through the first diode D1. Similarly, when an ESD event with a voltage negative relative to the Vss voltage supply rail is applied to the output pad 310, the second diode D2 is forward biased. As the Vdd voltage supply rail is floating, the first diode D1 is inactive. Therefore, the ESD event (voltage) is discharged to the Vss voltage supply rail through the second diode D2.

When an ESD event with a voltage negative relative to the Vdd voltage supply rail is applied to the output pad 310, the first diode D1 is reverse biased. As the Vss voltage supply rail is floating, the voltage Vss will follow up to the output pad 310 with a negative voltage. Meanwhile, the first diode series 312 (Du1, Du2, ..., Dun) are forward biased, so that the negative ESD discharge current flows from the first diode series 312 (Du1, Du2, ..., Dun) to Vdd.

When an ESD event with a voltage positive relative to the Vss voltage supply rail is applied to the output pad 310, the second diode D2 is reverse biased. As the Vdd voltage supply rail is floating, the voltage Vdd will follow up to the output pad 310 with a positive voltage. Meanwhile, the second diode series 314 (Dd1, Dd2, ..., Ddn) are forward biased, the ESD discharge current flows from the second diode series 314 (Dd1, Dd2, ..., Ddn) to Vss.

Figure 12:
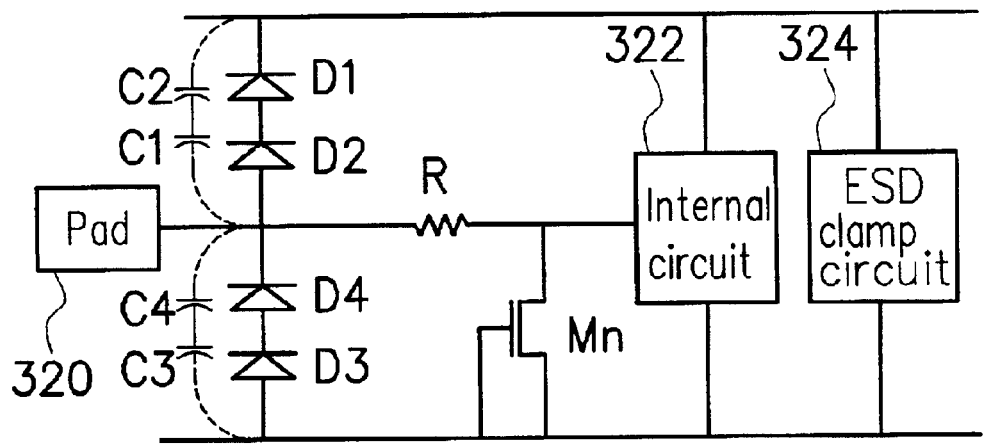
FIG. 12 illustrates another input ESD protection circuit of the SOI non-gated diode with power-rail ESD clamp.

FIG. 12 illustrates the input ESD protection circuit with the SOI non-gated diode as shown in FIG. 2 or FIG. 9. As shown in FIG. 12, the ESD protection includes an input pad 320, a first diode D1, a second diode D2, a third diode D3, a fourth diode D4, a Vdd voltage supply rail, a Vss voltage supply rail, an NMOS transistor Mn, and an ESD clamp circuit 324. The internal circuit 322 is coupled between the Vdd and Vss voltage supply rails, the input resistor R and the NMOS transistor Mn. The first and second diodes D1 and D2 are serially connected to each other with the anode of the first diode D1 connecting to the input pad 320 and the cathode of the second diode D1 connecting to Vdd. The third diode D3 and the fourth diode D4 are connected to each other in series with the anode of the third diode D3 connecting to Vss, and the cathode of the fourth diode D4 connecting to the input pad 320. The input resistor R has one terminal coupled to the pad 320, and the other terminal coupled to the drain region of the NMOS transistor Mn and the internal circuit 322. The gate and source region of the NMOS transistor are coupled to Vss. The above diodes D1, D2, D3 and D4 include the SOI non-gated diode as shown in FIG. 2 or FIG. 9.

The operation of the circuit in FIG. 12 is similar to those in FIG. 10 or FIG. 11, so that the description thereof is not repeated. As shown in FIG. 12, the first and the second diodes D1 and D2 are to replace the diode D1 in FIG. 10 or 11, while the third and fourth diodes D3 and D4 are to replace the diode D2 in FIG. 10 or 11. The diodes D1, D2, D3 and D4 have a parasitic junction capacitor C1, C2, C3 and C4, respectively. In FIG. 10, the input capacitance Cin is C1+C2, while in the embodiment as shown in FIG. 12, the input capacitance Cin is [C1C2/(C1+C2)]+[C3C4/(C3+C4)]. If the diodes D1, D2, D3 and D4 are the same, then C1=C2=C3=C4=C. Therefore, Cin=2C, and Cin'=C. The input capacitance of FIG. 12 is reduced, so that the RC time constant is reduced. By reducing the input delay, the ESD protection circuit can be applied to the high frequency (HF) circuits.

Figure 13:
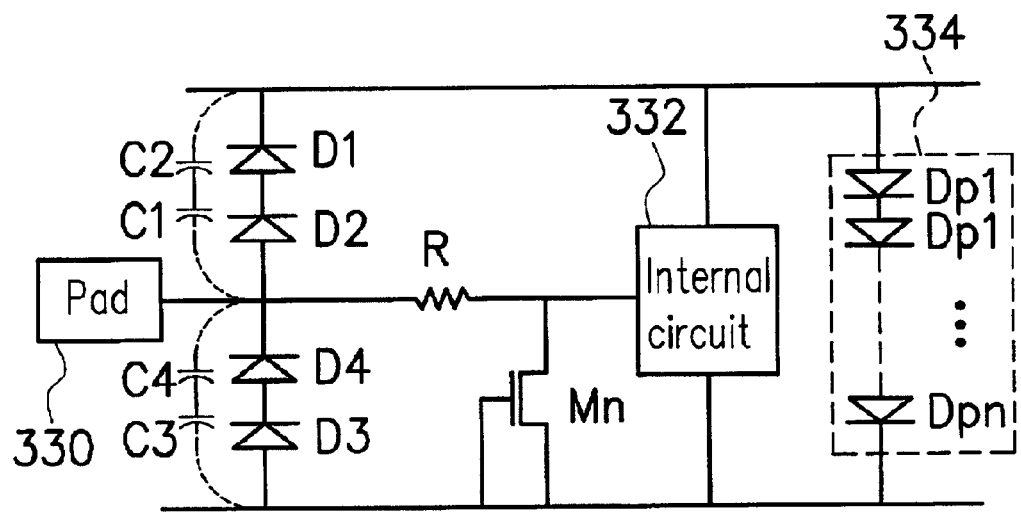
FIG. 13 illustrates another ESD protection circuit of the SOI non-gated diode with the power-rail ESD clamp realized by the non-gated diodes.

FIG. 13 illustrates a modification of FIG. 12. A diode series 334 is used to realize the ESD clamp circuit between Vdd and Vss. The diode series 334 is used as an ESD clamp circuit. The diode series 334 comprises diodes Dp1, Dp2, ..., Dpn such as the SOI non-gated diode in FIG. 2 or FIG. 9 serially connected together.

Thus, the invention has the advantages:

1. The non-gated diode is compatible to the general SOI COS fabrication process (such as FIG. 5A to FIG. 5G) and the general bulk CMOS fabrication process (such as FIG. 7A to FIG. 7G).

2. More PN junction area is obtained compared to gated diode, so that the SOI non-gated diode has lower power density.

3. More PN junction area is obtained compared to gated diode, so that the SOI non-gated diode has higher ESD robustness.

4. The non-gated diode provided by the invention can be used in mixed voltage and analog/digital applications. In addition, the non-gated diode can be used as the input/output ESD protection circuit, and the protection circuit between Vss and Vdd under a forward biased condition.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An ESD protection circuit of a non-gated diode coupled between an input pad and an internal circuit, comprising:

a high-voltage supply rail and a low-voltage supply rail;

a first diode, with a cathode connected to the high-voltage supply rail and an anode connected to a node;

a second diode, with an anode connected to the low-voltage supply rail and a cathode connected to the node;

a first diode series, having a plurality of serially connected diodes, wherein an anode thereof is connected to the high-voltage supply rail and a cathode thereof is connected to the node; and a second diode series, having a plurality of serially connected diodes, wherein a cathode thereof is connected to the low-voltage supply rail and an anode thereof is connected to the node, wherein the first and second diodes have different dimensions.

2. The ESD protection circuit according to claim 1, wherein when a voltage positive relative to the high-voltage supply rail is applied to the input pad, the ESD protection circuit provides a discharge path from the first diode to the high-voltage supply rail.

3. The ESD protection circuit according to claim 1, wherein when a voltage negative relative to the low-voltage supply rail is applied to the input pad, the ESD protection circuit provides a discharge path from the second diode to the low-voltage supply rail.

4. The ESD protection circuit according to claim 1, wherein when a voltage negative relative to the high-voltage supply rail is applied to the input pad, the ESD protection circuit provides a discharge path from the second diode, the second diode series and the first diode series to the high-voltage supply rail.

5. The ESD protection circuit according to claim 1, wherein when a voltage positive relative to the low-voltage supply rail is applied to the input pad, the ESD protection circuit provides a discharge path from the first diode, the first diode series and the second diode series to the low-voltage supply rail.

6. The ESD protection circuit according to claim 1, wherein each of the first diode, the second diode, the first diode series and the second diode series includes a non-gate diode formed by SOI fabrication process.

7. The ESD protection circuit according to claim 1, wherein each of the first diode, the second diode, the first diode series and the second diode series includes a non-gate diode formed by bulk CMOS fabrication process.

8. An ESD protection circuit of a non-gated diode, coupled between an output pad and a pre-driver, comprising:

a high-voltage supply rail and a low-voltage supply rail, connected to the pre-driver;

a first diode, with a cathode connected to the high-voltage supply rail and an anode connected to a node;

a second diode, with an anode connected to the low-voltage supply rail and a cathode connected to the node;

a first diode series, having a plurality of serially connected diodes, wherein an anode thereof is connected to the high-voltage supply rail and a cathode thereof is connected to the node;

a second diode series, having a plurality of serially connected diodes, wherein a cathode thereof is connected to the low-voltage supply rail and an anode thereof is connected to the node; and a first type MOS transistor, with a source region connected to the high-voltage supply rail, a drain region connected to the node and a gate connected to the pre-driver; and a second type MOS transistor, with a source region connected to the low-voltage supply rail, a drain region connected to the node and a gate connected to the gate of the first type MOS transistor, wherein the first and second diodes have the same dimension or different dimensions.

9. The ESD protection circuit according to claim 8, wherein when a voltage positive relative to the high-voltage supply rail is applied to the output pad, the ESD protection circuit provides a discharge path from the first diode to the high-voltage supply rail.

10. The ESD protection circuit according to claim 8, wherein when a voltage negative relative to the low-voltage supply rail is applied to the output pad, the ESD protection circuit provides a discharge path from the second diode to the low-voltage supply rail.

11. The ESD protection circuit according to claim 8, wherein when a voltage negative relative to the high-voltage supply rail is applied to the output pad, the ESD protection circuit provides a discharge path from the second diode, the second diode series and the first diode series to the high-voltage supply rail.

12. The ESD protection circuit according to claim 8, wherein when a voltage positive relative to the low-voltage supply rail is applied to the output pad, the ESD protection circuit provides a discharge path from the first diode, the first diode series and the second diode series to the low-voltage supply rail.

13. The ESD protection circuit according to claim 8, wherein each of the first diode, the second diode, the first diode series and the second diode series includes a non-gate diode formed by SOI fabrication process.

14. The ESD protection circuit according to claim 8, wherein each of the first diode, the second diode, the first diode series and the second diode series includes a non-gate diode formed by bulk CMOS fabrication process.

15. The ESD protection circuit according to claim 8, wherein the first type MOS transistor includes a PMOS transistor, and the second type transistor includes an NMOS transistor.

16. An ESD protection circuit of a non-gated diode, coupled between an input pad and an internal circuit, comprising:

a high-voltage supply rail and a low-voltage supply rail, connected to the internal circuit;

a first diode and a second diode serially connected together, wherein an anode of the first diode is connected to a node, and a cathode of the second diode is connected to the high-voltage supply rail;

a third diode and a fourth diode serially connected together, wherein an anode of the third diode is connected to the low-voltage supply rail a node, and a cathode of the fourth diode is connected to the node; and an ESD clamp circuit, connected between the high- and low-voltage supply rails, wherein the first, second, third and fourth diodes have the same dimension or different dimensions.

17. The ESD protection circuit according to claim 16, wherein the ESD clamp circuit comprises a plurality of serially connected diodes with an anode connected to the high-voltage supply rail and a cathode connected to the low-voltage supply rail.

18. The ESD protection circuit according to claim 16, wherein each of the first diode, the second diode, the third diode and the fourth diode includes a non-gate diode formed by SOI fabrication process.

19. The ESD protection circuit according to claim 16, wherein each of the first diode, the second diode, the third diode and the fourth diode includes a non-gate diode formed by bulk CMOS fabrication process.

20. The ESD protection circuit according to claim 16, wherein each diode of the ESD clamp circuit includes a non-gate diode formed by SOI fabrication process.

21. The ESD protection circuit according to claim 16, wherein each diode of the ESD clamp circuit includes a non-gate diode formed by bulk CMOS fabrication process.

* * * * *